(12) United States Patent
Kim

(10) Patent No.: US 8,969,821 B2
(45) Date of Patent: Mar. 3, 2015

(54) APPARATUS FOR DETECTING X-RAY

(71) Applicant: Dong Hyuk Kim, Yongin (KR)

(72) Inventor: Dong Hyuk Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/938,502

(22) Filed: Jul. 10, 2013

(65) Prior Publication Data

US 2014/0070108 A1  Mar. 13, 2014

(30) Foreign Application Priority Data

Sep. 11, 2012  (KR) .................. 10-2012-0100546

(51) Int. Cl.
  *H01L 27/146* (2006.01)

(52) U.S. Cl.
  CPC .... *H01L 27/14658* (2013.01); *H01L 27/14663* (2013.01); *H01L 27/14603* (2013.01); *H01L 27/14609* (2013.01)

USPC ..................................... 250/370.09

(58) Field of Classification Search
  CPC ................................ H01L 27/14658
  USPC .................. 250/370.09; 257/59, 72, 290
  See application file for complete search history.

(56) References Cited

U.S. PATENT DOCUMENTS 6,885,397 B1  4/2005  Ducourant
2012/0268701 A1*  10/2012  Nemoto et al. ............. 349/106

FOREIGN PATENT DOCUMENTS

| KR | 10-2011-0083338 A | 7/2011 |
| KR | 10-2011-0109066 A | 10/2011 |
| KR | 10-2012-0001991 A | 1/2012 |

* cited by examiner

*Primary Examiner* — David Porta
*Assistant Examiner* — Faye Boosalis
(74) *Attorney, Agent, or Firm* — Lee & Morse, P.C.

(57) ABSTRACT

An apparatus for detecting an X-ray includes a photo diode having an anode electrode and a cathode electrode, a switching transistor, and a first storage capacitor that has one end connected to the cathode electrode and another end connected to the switching transistor.

19 Claims, 8 Drawing Sheets

APPARATUS FOR DETECTING X-RAY

CROSS-REFERENCE TO RELATED APPLICATION

This application claims priority from Korean Patent Application No. 10-2012-0100546 filed on Sep. 11, 2012 in the Korean Intellectual Property Office, the disclosure of which is incorporated herein by reference in its entirety.

BACKGROUND

An X-ray detection system is a system that transmits X-rays through an object, e.g., human body, and that detects the amount of the transmitted X-rays to photograph the interior of the object. The X-ray detection system may be used as a medical testing device and as a non-destructive testing device.

SUMMARY

Embodiments may be realized by providing an apparatus for detecting an X-ray, the X-ray detecting apparatus may have a photo diode including an anode electrode and a cathode electrode, a switching transistor, and a first storage capacitor having one end connected to the cathode electrode and another end connected to the switching transistor.

The first storage capacitor may be connected to the photo diode in series. A bias voltage may be applied to the anode electrode.

The apparatus may include a data line. The switching transistor may include a gate electrode, a first electrode, and a second electrode. The first electrode may be connected to the other end of the first storage capacitor and the second electrode may be connected to the data line. The apparatus may include a second storage capacitor having one end connected to the anode electrode and another end to which a bias voltage is applied.

Embodiments may also be realized by providing an apparatus for detecting an X-ray, the X-ray detecting apparatus having an X-ray receiving portion including a plurality of light sensing pixels, and a data detector that detects an electrical signal transmitted from the X-ray receiving portion. Each of the plurality of light sensing pixels includes a photo diode including an anode electrode and a cathode electrode, a switching transistor, and a first storage capacitor having one end connected to the cathode electrode and the other end connected to the switching transistor.

The first storage capacitor may be connected to the photo diode in series. The apparatus may include a data line. The switching transistor may include a gate electrode, a first electrode, and a second electrode. The first electrode may be connected to the other end of the first storage capacitor and the second electrode may be connected to the data line.

The data detector may include a read-out portion connected to the data line. The read-out portion may include an amplifier, a feedback capacitor, and a reset switch. The data line may be connected to a first input port of the amplifier, a reference voltage may be applied to a second input port of the amplifier, one end of the feedback capacitor may be connected to an output port of the amplifier, and the reset switch may be connected to the feedback capacitor in parallel.

Embodiments may also be realized by providing an apparatus for detecting an X-ray, the X-ray detecting apparatus having a photo diode including an anode electrode and a cathode electrode, a switching transistor, a bias line, and a storage capacitor having one end connected to the bias line and the other end connected to the anode electrode.

The storage capacitor may be connected to the photo diode in series. The apparatus may include a data line. The switching transistor may include a gate electrode, a first electrode and a second electrode. The first electrode may be connected to the other end of the first storage capacitor and the second electrode may be connected to the data line.

Embodiments may also be realized by providing an apparatus for detecting an X-ray, the X-ray detecting apparatus having a thin film transistor formed on a substrate and including a gate electrode, a first electrode, and a second electrode, a first interlayer dielectric film formed on the thin film transistor, a cathode electrode formed on first electrode and electrically connected to the first electrode, a photoconductor layer formed on the cathode electrode, an anode electrode formed on the photoconductor layer.

The first electrode and the cathode electrode may constitute both ends of the storage capacitor. The apparatus may include a second interlayer dielectric film on the anode electrode, and a bias line that is on the second interlayer dielectric film and that is electrically connected to the anode electrode through a contact hole. The apparatus of may include a second interlayer dielectric film on the anode electrode, and a bias line that overlaps the anode electrode with the second interlayer dielectric film interposed between the bias line and the anode electrode.

Embodiments may also be realized by providing an apparatus for detecting an X-ray, the X-ray detecting apparatus having a thin film transistor formed on a substrate and including a gate electrode, a first electrode, and a second electrode, a first interlayer dielectric film formed on the thin film transistor, a cathode electrode formed on first electrode and electrically connected to the first electrode, a photoconductor layer formed on the cathode electrode, an anode electrode formed on the photoconductor layer, a second interlayer dielectric film formed on the anode electrode, and a bias line formed to overlap the anode electrode with the second interlayer dielectric film interposed between the bias line and the anode electrode.

The first electrode and the cathode electrode may constitute both ends of the storage capacitor.

BRIEF DESCRIPTION OF THE DRAWINGS

Features will become more apparent to those of ordinary skill in the art by describing in detail preferred embodiments thereof with reference to the attached drawings in which.

DETAILED DESCRIPTION

Features of the embodiments and methods of accomplishing the same may be understood more readily by reference to the following detailed description of exemplary embodiments and the accompanying drawings. Embodiments, however, may be embodied in many different forms and should not be construed as being limited to the embodiments set forth herein. Rather, these embodiments are provided so that this disclosure will be thorough and complete and will fully convey the concept of the scope to those skilled in the art.

It will be understood that when an element or layer is referred to as being "on", another element or layer, it can be directly on the other element or layer or intervening elements or layers may be present. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings.

Hereinafter, exemplary embodiments will be described with reference to the accompanying drawings.

Figure 1:
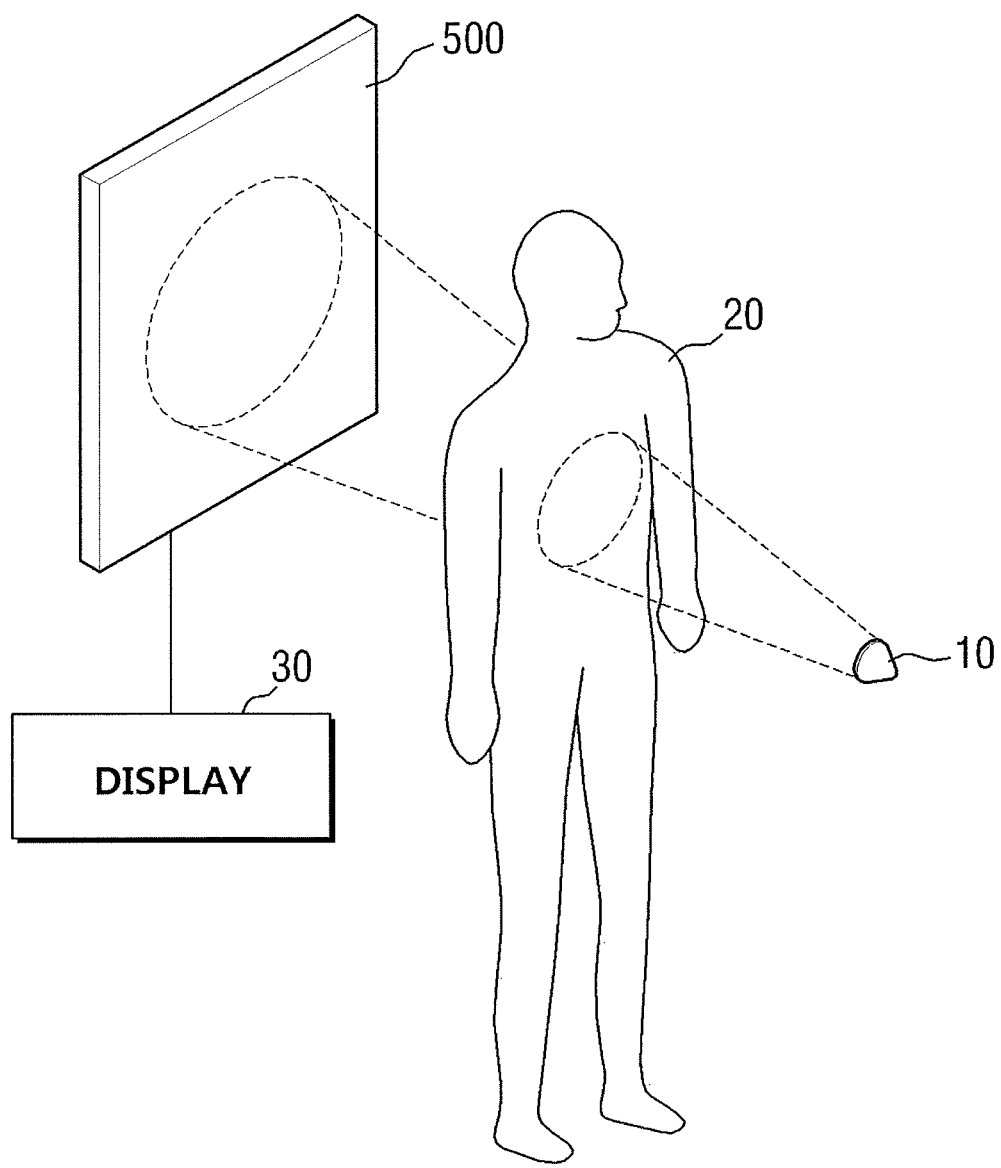
FIG. 1 is a schematic diagram illustrating a method for detecting an X-ray using an X-ray detecting apparatus according to an exemplary embodiment.

FIG. 1 is a schematic diagram illustrating a method for detecting X-rays using an X-ray detecting apparatus according to an exemplary embodiment.

Referring to FIG. 1, X-rays are irradiated from an X-ray generator 10, transmitted through a subject 20 to then be incident into the X-ray detecting apparatus 500. The X-ray detecting apparatus 500 includes a scintillator (not shown) installed to convert the incident X-rays into visible light. The converted visible light is changed into an electrical signal through a photoelectric conversion element, such as a photo diode, provided in the X-ray detecting apparatus 500. The changed electrical signal is detected and input to a display 30 to display an X-ray image.

Hereinafter, an X-ray detecting apparatus according to an exemplary embodiment will be described in more detail with reference to FIG. 2.

Figure 2:
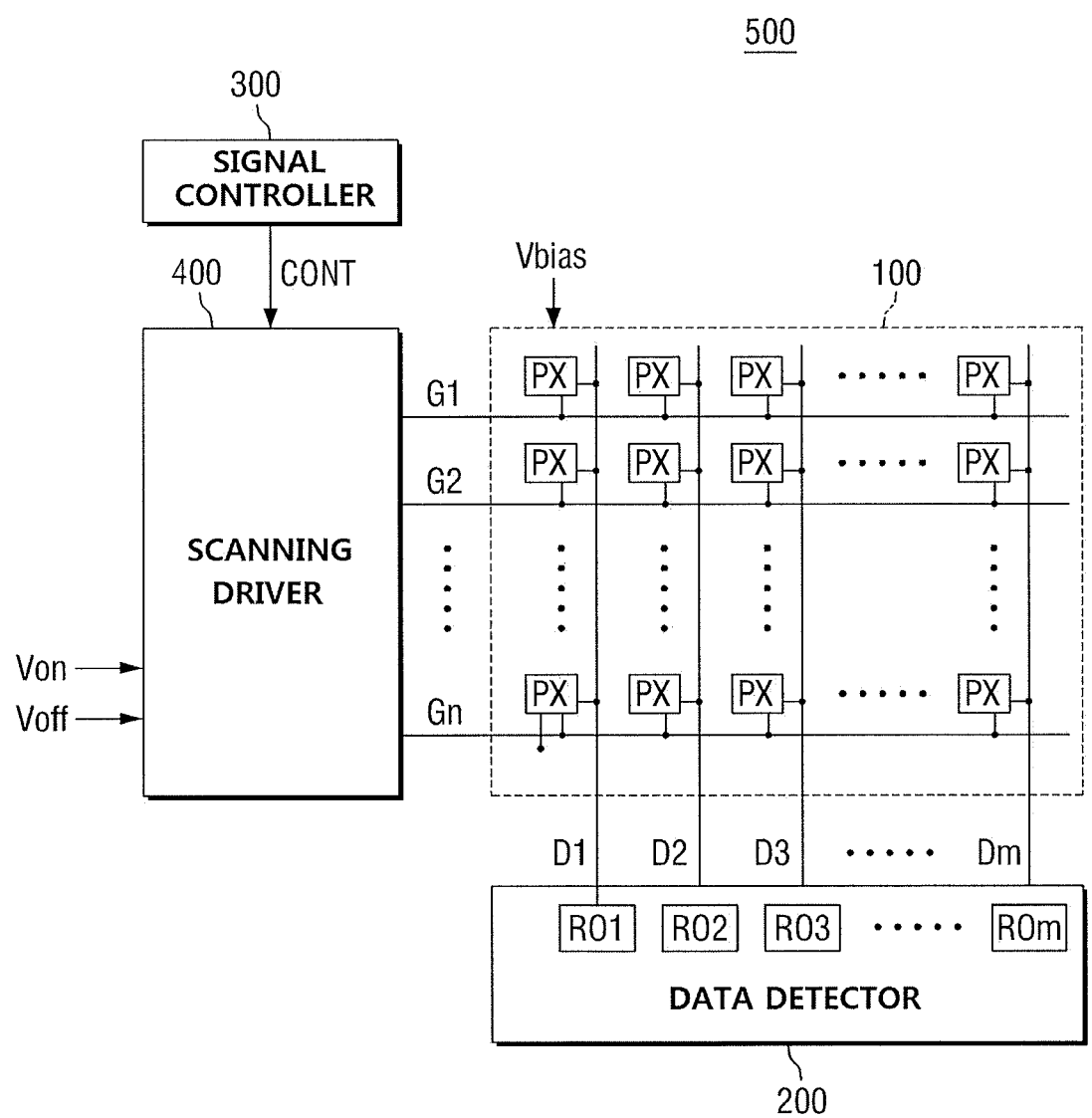
FIG. 2 is a schematic view of an X-ray detecting apparatus according to an exemplary embodiment.

FIG. 2 is a schematic diagram of an X-ray detecting apparatus according to an exemplary embodiment.

As shown in FIG. 2, the X-ray detecting apparatus 500 may include an X-ray receiving portion 100, a data detector 200, a signal controller 300, and a scanning driver 400.

The X-ray receiving portion 100 may include a plurality of scanning lines G1~Gn, a plurality of data lines D1~Dm, and a plurality of light sensing pixels PXs. The plurality of light sensing pixels PXs may be connected to the signal lines G1~Gn and D1~Dm to be arrayed in a matrix configuration. The scanning lines G1~Gn extend in a row direction to be substantially parallel to each other, and the data lines D1~Dm extend in a column direction to be substantially parallel to each other. A bias voltage Vbias used for operation of each of the plurality of light sensing pixels PXs may be applied to the X-ray receiving portion 100.

When the X-ray detecting apparatus 500 is based on an indirect method, a scintillator layer for converting an X-ray into visible light may be formed on a surface of the X-ray receiving portion 100, into which the X-ray is incident. The scintillator layer may be formed of cesium iodide (CsI), gadolinium oxysulfide (GOS), or the like.

When the X-ray detecting apparatus 500 is based on a direct method, the X-ray receiving portion 100 may include a photoconductor layer (not shown). The photoconductor layer may include at least one of amorphous silicon (a-Si), $HgI_2$, $PbI_2$, and CdZnTe.

The signal controller 300 generates a scan driving signal CONT in response to a signal supplied from an external device. The scan driving signal CONT controls the operation of the scanning driver 400. The signal controller 300 supplies the generated scan driving signal CONT to the scanning driver 400.

The scanning driver 400 is connected to the plurality of scanning lines G1~Gn of the X-ray receiving portion 100, generates a plurality of scanning signals composed of combinations of a gate-on voltage Von that turns on a switching transistor, or a gate-off voltage Voff that turns off the switching transistor, according to the scan driving signal CONT and applies the generated scanning signals to the plurality of scanning lines G1~Gn. The plurality of scanning signals control data signal outputs in the X-ray receiving portion 100.

The data detector 200 includes read-out portions RO1~ROm connected to the data lines D1~Dm of the X-ray receiving portion 100, respectively. The respective read-out portions RO1~ROm may receive and read the current transmitted from the light sensing pixels PXs of the X-ray receiving portion 100 through the respective data linens D1~Dm and may generate digital data signals.

Each of various drivers, such as the signal controller 300, the scanning driver 400 and the data detector 200, may be directly mounted on the X-ray receiving portion 100 in the form of at least one integrated circuit chip. In another embodiment, the driver may be mounted on a flexible printed circuit film (not shown), may be attached to an X-ray receiving portion in the form of a tape carrier package (TCP), or may be mounted on a separate printed circuit board) (not shown). In another exemplary embodiment, the drivers may be integrated into the X-ray receiving portion 100 together with the signal lines G1~Gn and D1~Dm.

Figure 3:
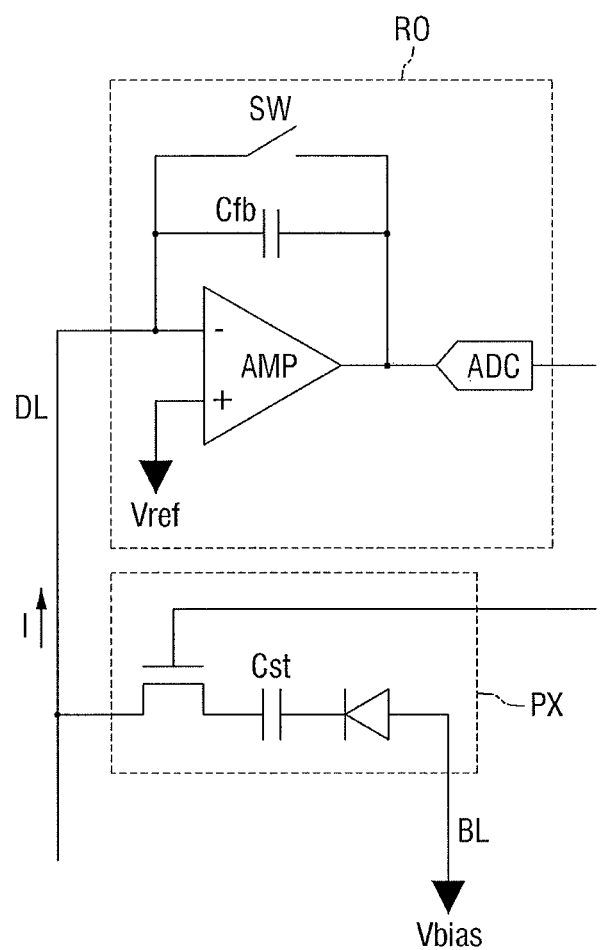
FIG. 3 is a circuit view of the X-ray detecting apparatus shown in FIG. 2.

FIG. 3 is a circuit view of the X-ray detecting apparatus according to an exemplary embodiment.

As shown in FIG. 3, a light sensing pixel PX of the X-ray detecting apparatus may comprise a photo diode PD, a storage capacitor Cst, and a switching transistor T. For example, the light sensing pixel PX may include the photo diode PD, which generates a current corresponding to the visible light incident through the scintillator layer, the switching transistor T, which is connected to a data line DL, the storage capacitor Cst, which is connected in series between the photo diode PD, and the switching transistor T.

The photo diode PD includes an anode electrode to which a bias voltage Vbias is applied, and a cathode electrode. The photo diode PD generates a current corresponding to the visible light incident through the scintillator layer. A hydrogenated amorphous silicon (a-Si:H) PIN diode may be used as the photo diode PD.

One end of the storage capacitor Cst is connected to the cathode electrode of the photo diode PD. In some embodiments, the one end of the storage capacitor Cst may be integrally formed with the cathode electrode of the photo diode PD. The other end of the storage capacitor Cst is connected to a first electrode of a switching transistor T.

The switching transistor T includes a gate electrode, a first electrode, and a second electrode. The first electrode may be a source electrode and the second electrode may be a drain electrode. In some embodiments, the first electrode may be a drain electrode and the second electrode may be a source electrode. The gate electrode is connected to a scanning line SL, the first electrode is connected to the other end of the storage capacitor Cst, and the second electrode is connected to a data line DL.

When the scanning signal Vsi of the gate-on voltage Von is applied from the scanning line SL, the switching transistor T is turned on. If the switching transistor T is turned on, a change in the current I flowing in the photo diode PD is transmitted to the first electrode of the switching transistor T through the storage capacitor Cst and then transmitted to the data line DL connected to the second electrode of the switching transistor T through the second electrode of the switching transistor T and to the read-out portions ROs. Throughout the specification, the current I generated from the photo diode PD and transmitted to the read-out portions ROs is referred to as a data signal.

The respective read-out portions ROs may read out the data signal from the light sensing pixels PXs. Each of the read-out portions RO may include at least one amplifier AMP, at least one feedback capacitor Cfb, and at least one reset switch SW. In some embodiments, the number of the amplifier AMP, the feedback capacitor Cfb, and the reset switch SW may be equal to the number of data lines DL.

The amplifier AMP may include a first input port, a second input port, an output port. The first input port may be connected to the data line DL that transmits a data signal of each of the light sensing pixels PXs. A reference voltage Vref, such as a ground voltage or a virtual ground voltage, may be applied to the second input port. In an exemplary embodiment, the first input port and the second input port may be an inverted input terminal and a non-inverted input terminal, respectively.

The output port of the amplifier AMP is connected to an analog-to-digital converter (ADC). The analog-to-digital converter ADC converts the output voltage Vout of the amplifier AMP to a digital signal. One end of the feedback capacitor Cfb may be connected to the first input port of the amplifier AMP, and the other end may be connected to the output port of the amplifier AMP.

The reset switch SW may be connected to the feedback capacitor Cfb in parallel. The reset switch SW may reset the feedback capacitor Cfb by discharging the voltage charged in the feedback capacitor Cfb. One end of the reset switch SW may be electrically connected to one end of the feedback capacitor Cfb. The other end of the reset switch SW may be electrically connected to the other end of the feedback capacitor Cfb. Therefore, if the reset switch SW is opened, a voltage may be charged to both ends of the feedback capacitor Cfb. However, if the reset switch SW is closed, the both ends of the feedback capacitor Cfb are electrically connected to each other, thereby discharging the voltage charged in both ends of the feedback capacitor Cfb.

As described above, if the storage capacitor Cst is connected to the photo diode PD in series, a pixel RC delay is reduced, thereby shortening the data read-out time. For example, when there is no current flowing, the anode electrode and the cathode electrode of the photo diode PD constitute a capacitor of the photo diode PD. The photo diode capacitor is connected to the storage capacitor Cst in series.

Therefore, assuming that capacitance of the photo diode PD capacitor is denoted by $C_p$ and capacitance of the storage capacitor Cst is denoted by $C_s$, a total capacitance $C_{total}$ between the bias line BL supplying the bias voltage Vbias and the first electrode of the switching transistor T may be calculated using the following equation.

$$1/C_{total}=1/C_p+1/C_s$$

As understood from the above equation, the total capacitance $C_{total}$ is smaller than the photo diode capacitance $C_p$. Since the photo diode capacitance is proportional to the pixel RC delay, a reduction in the photo diode capacitance may reduce the pixel RC delay accordingly.

If the pixel RC delay is reduced, a pixel read-out time may be reduced. Therefore, it may be advantageously applied to a field to provide a short pixel read-out time, like in an X-ray detecting motion picture.

Figure 4:
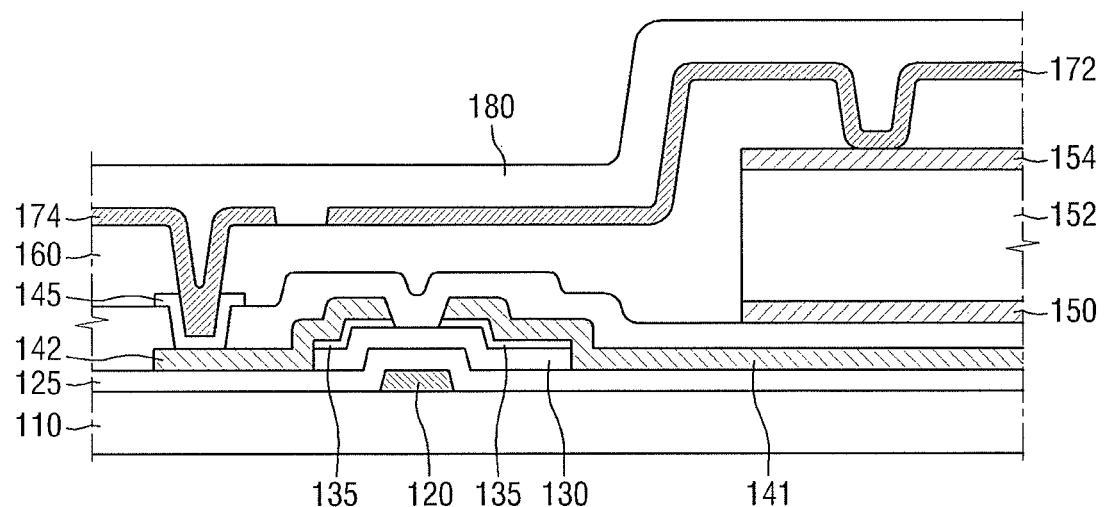
FIG. 4 is a cross-sectional view of the X-ray detecting apparatus shown in FIG. 2.

Hereinafter, an exemplary pixel configuration of the aforementioned X-ray detecting apparatus will be described. FIG. 4 is a cross-sectional view of the X-ray detecting apparatus shown in FIG. 2.

Referring to FIG. 4, a gate electrode 120 is formed on a substrate 110. The gate electrode 120 may be made of aluminum (Al), silver (Ag), copper (Cu), molybdenum (Mo), chrome (Cr), titanium (Ti), tantalum (Ta), or alloys thereof. The gate electrode 120 may have a multi-layered structure consisting of two conductive films (not shown) having different physical properties.

A gate insulation film 125 is formed on the gate electrode 120. The gate insulation film 125 is made of an insulating material, such as silicon oxide, silicon nitride, silicon oxynitride, tetraethoxysilane (TEOS), or the like.

A semiconductor layer 130 is formed on the gate insulation film 125. The semiconductor layer 130 may overlap the gate electrode 120. The semiconductor layer 130 may be made of amorphous silicon or polysilicon.

An ohmic contact layer 135 may be formed on the semiconductor layer 130. The ohmic contact layer 135 may be made of silicide or amorphous silicon heavily doped with n-type impurity. The ohmic contact layer 135 may be formed on the gate electrode 120 to be spaced apart from each other.

A first electrode 141 and a second electrode 142 are formed on the ohmic contact layer 135. The first electrode 141 and the second electrode 142 are formed to be spaced apart from each other on the gate electrode 120. The first electrode 141 may extend to overlap a cathode electrode 150 to be described later. The first electrode 141 and the second electrode 142 may be made of aluminum (Al), silver (Ag), copper (Cu), molybdenum (Mo), chrome (Cr), titanium (Ti), tantalum (Ta), or alloys thereof. The first electrode 141 and the second electrode 142 may be formed of a stack having two or more layers.

The gate electrode 120, the semiconductor layer 130, the first electrode 141, and the second electrode 142 may form a bottom-gate type thin film transistor, constituting a switching transistor T.

A first interlayer dielectric film 145 is formed on the first electrode 141 and the second electrode 142.

The cathode electrode 150 is formed on the first interlayer dielectric film 145. The cathode electrode 150 may be formed at a location overlapping with the extended first electrode 141 with the first interlayer dielectric film 145 interposed between the cathode electrode 150 and the first electrode 141. Therefore, the cathode electrode 150 and the first electrode 141 with the first interlayer dielectric film 145 interposed therebetween may constitute a storage capacitor Cst.

The cathode electrode 150 may be made of a metal having a low work function, e.g., silver (Ag), magnesium (Mg), aluminum (Al), platinum (Pt), lead (Pd), gold (Au), nickel (Ni), neodymium (Nd), iridium (Ir), chrome (Cr), lithium (Li), calcium (Ca), or alloys thereof.

In addition, a first contact hole is formed on the first interlayer dielectric film 145 to expose the second electrode 142, and a first connecting electrode 156 may be formed in the first contact hole. The first connecting electrode 156 may be made of the same material with the cathode electrode 150.

A photoconductor layer 152 is formed on the cathode electrode. The photoconductor layer 152 may include an amorphous silicon layer including N-type impurity, an intrinsic amorphous silicon layer not including impurity, and an amorphous silicon layer including P-type impurity. The photoconductor layer 152 may generate electrons or holes by external light.

An anode electrode 154 is formed on the photoconductor layer 152. The anode electrode 154 may be formed of a transparent conductive film. For example, the anode electrode 154 may be made of indium tin oxide (ITO), tin oxide (TO), indium zinc oxide (IZO), indium tin zinc oxide (ITZO), or a combination thereof.

The cathode electrode 150, the photoconductor 152 and the anode electrode 154 are disposed to overlap with each other and constitute a photo diode PD.

A second interlayer dielectric film 160 is formed on the anode electrode 154. A second contact hole exposing the first connecting electrode 156 and a third contact hole exposing the anode electrode 154 may be formed on the second interlayer dielectric film 160. A second connecting electrode 174 is formed in the second contact hole to be electrically connected to the first connecting electrode 156. The second connecting electrode 174 may be connected to a data line (not shown).

In addition, a bias line 172 may be foamed on the second interlayer dielectric film 160. The bias line 172 may be made of the same material with a second connecting electrode 174. The bias line 172 may be connected to the anode electrode 154 through the third contact hole.

The second connecting electrode 174 and the bias line 172 may be covered by a passivation film 180 and then be protected.

The exemplary pixel shown in FIG. 4 is configured such that the first electrode 141 forming one end of the bottom-gate type thin film transistor overlaps the photo diode PD with the first interlayer dielectric film 145 interposed between the first electrode 141 and the photo diode PD, thereby implementing the storage capacitor Cst connected to the photo diode PD in series.

Figure 5:
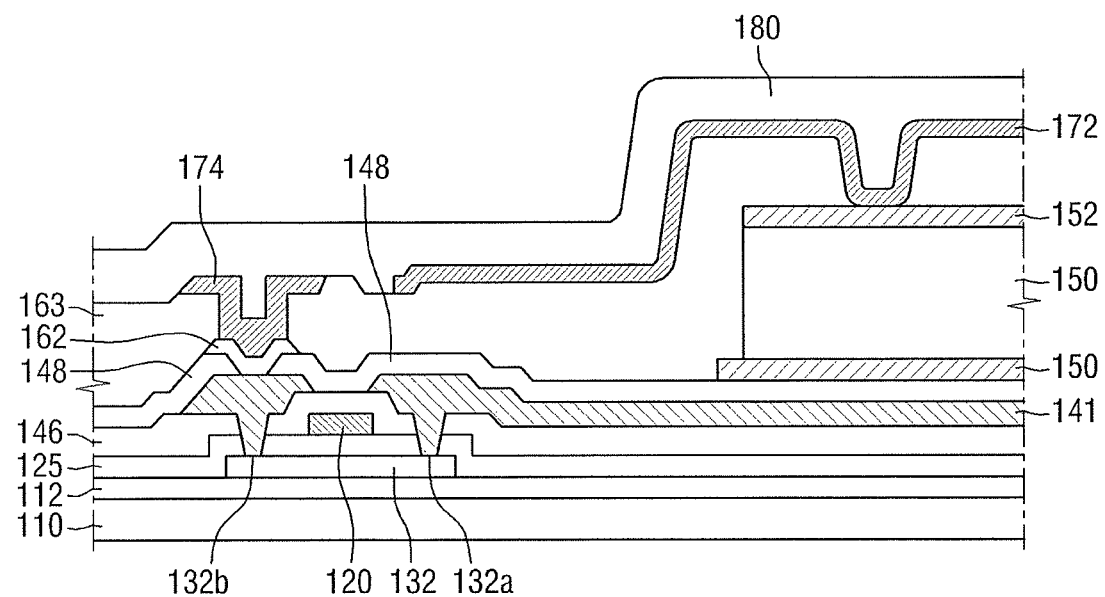
FIG. 5 is a cross-sectional view of an X-ray detecting apparatus according to an exemplary embodiment.

FIG. 5 is a cross-sectional view of an X-ray detecting apparatus according to another exemplary embodiment.

Referring to FIG. 5, the X-ray detecting apparatus according to another exemplary embodiment is different from the X-ray detecting apparatus shown in FIG. 4, in that it employs a top gate type thin film transistor.

The following description will focus on differences between the X-ray apparatuses according to the previous and present embodiments. A buffer layer 112 is formed on the entire surface of a substrate 110. The buffer layer 112 may be made of an inorganic material, such as silicon oxide, silicon nitride, silicon oxynitride, aluminum oxide, aluminum nitride, titanium oxide, or titanium nitride, or an organic material, such as polyimide, polyester or acryl, or a stack of these materials. The buffer layer 112 may not be formed.

A semiconductor layer 132 is formed on the buffer layer 112. First and second heavily doped regions 132a and 132b doped with high-concentration N-type impurity may be formed at both ends of the semiconductor layer 132.

A gate insulation film 125 is formed on the semiconductor layer 132. A gate electrode 120 is formed on the gate insulation film 125 to overlap the semiconductor layer 132. A first interlayer dielectric film 146 is formed on the gate electrode 120, and a first electrode 141 and a second electrode 142 are formed on the first interlayer dielectric film 146. The first electrode 141 may extend to overlap with a cathode electrode 150 to be described later.

The first electrode 141 makes contact with the first heavily doped region 132a of the semiconductor layer 132 through a first contact hole penetrating the first interlayer dielectric film 146 and the gate insulation film 125. The second electrode 142 makes contact with the second heavily doped region 132b of the semiconductor layer 132 through a second contact hole penetrating the first interlayer dielectric film 146 and the gate insulation film 125.

The gate electrode 120, the semiconductor layer 132, the first electrode 141, and the second electrode 142 may form a top-gate type thin film transistor, constituting a switching transistor T.

The first electrode 141 and the second electrode 142 are covered by a second interlayer dielectric film 148. A cathode electrode 150 is formed on the second interlayer dielectric film 148. The cathode electrode 150 may be formed at a location overlapping with the extended first electrode 141 with the second interlayer dielectric film 148 interposed between the cathode electrode 150 and the first electrode 141. Therefore, the cathode electrode 150 and the first electrode 141 with the second interlayer dielectric film 148 interposed therebetween may constitute a storage capacitor Cst.

A third contact hole may be formed on the second interlayer dielectric film 148 to expose the second electrode 142, and a first connecting electrode 162 is formed in the third contact hole. The first connecting electrode 162 may be made of the same material with the cathode electrode 150.

A photoconductor layer 152 and an anode electrode 154 are formed on the cathode electrode 150, and a third interlayer dielectric film 163 is formed on the anode electrode 154. A second connecting electrode 174 and a bias line 172 made of the same material may be formed on the third interlayer dielectric film 163. The second connecting electrode 174 is connected to the first connecting electrode 162 through the fourth contact hole formed on the third interlayer dielectric film 163, and the anode electrode 154 is connected to the bias line 172 through the fifth contact hole.

The second connecting electrode 174 and the bias line 172 may be covered by a passivation film 180 and then may be protected.

The exemplary pixel shown in FIG. 5 is configured such that the first electrode 141 forming one end of the top-gate type thin film transistor overlaps the photo diode PD with the second interlayer dielectric film 148 interposed between the first electrode 141 and the photo diode PD, thereby implementing the storage capacitor Cst connected to the photo diode PD in series.

Figure 6:
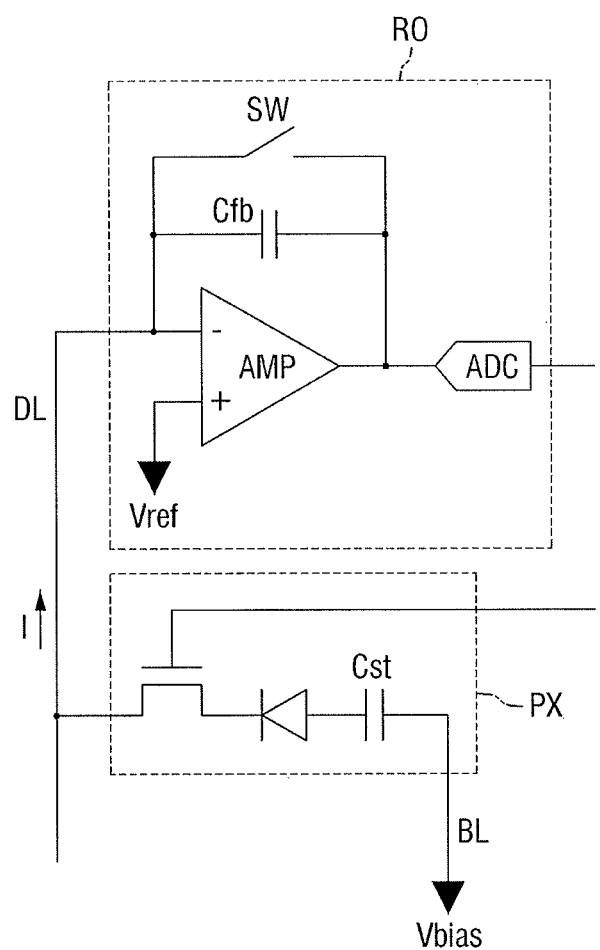
FIG. 6 is a circuit view of an X-ray detecting apparatus according an exemplary embodiment.

FIG. 6 is a circuit view of an X-ray detecting apparatus according to another exemplary embodiment.

Referring to FIG. 6, the X-ray detecting apparatus according to another exemplary embodiment is different from the X-ray detecting apparatus shown in FIG. 3, in that a storage capacitor Cst is connected to an anode electrode of a photo diode PD. For example, one end of the storage capacitor Cst is connected to a bias line BL supplying a bias voltage Vbias and the other end of the storage capacitor Cst is connected to the anode electrode of the photo diode PD.

With this configuration, a total capacitance between the bias line BL supplying the bias voltage Vbias and the first electrode of the switching transistor T may be reduced, compared to a case where a storage capacitor Cst is not connected. Therefore, the pixel RC delay is reduced and a pixel read-out time is shortened.

Figure 7:
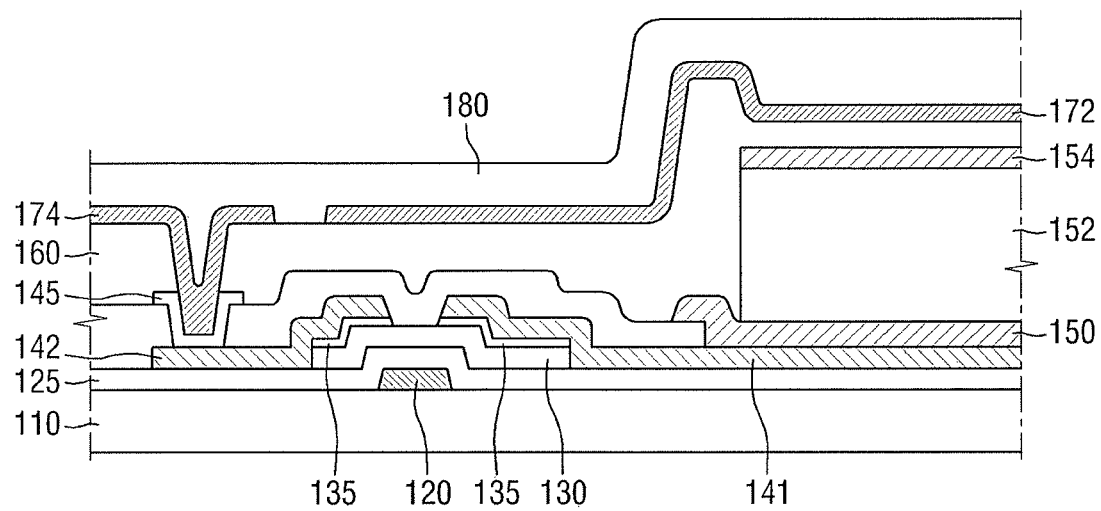
FIG. 7 is a cross-sectional view of the X-ray detecting apparatus shown in FIG. 6.

FIG. 7 is a cross-sectional view of the X-ray detecting apparatus shown in FIG. 6, illustrating an exemplary pixel of the X-ray detecting apparatus having a circuit configuration.

Referring to FIG. 7, in the X-ray detecting apparatus, a first interlayer dielectric film 145 exposes a portion of the first electrode 141. A cathode electrode 150 is formed directly on the first electrode 141. That is to say, the first electrode 141 and the cathode electrode 150 are directly electrically connected to each other. In another embodiment, the first electrode 141 and the cathode electrode 150 may be electrically connected by a contact or other conductors.

The X-ray detecting apparatus according to the present embodiment is the same as the X-ray detecting apparatus shown in FIG. 4 in that a second interlayer dielectric film 160 is formed on the anode electrode 154, but is different in that a bias line 172 does not make contact with the anode electrode 154. The bias line 172 and the anode electrode 154 with the second interlayer dielectric film 160 interposed therebetween may constitute a storage capacitor Cst.

To increase the capacitance of the storage capacitor Cst, it is desirable to form an insulation film as thinly as possible. To this end, the second interlayer dielectric film 160 formed on the anode electrode 154 may include a recess region.

FIG. 7 illustrates a bottom-gate type thin film transistor is employed, but aspects are not limited thereto. For example, a top-gate type thin film transistor may also be used.

Figure 8:
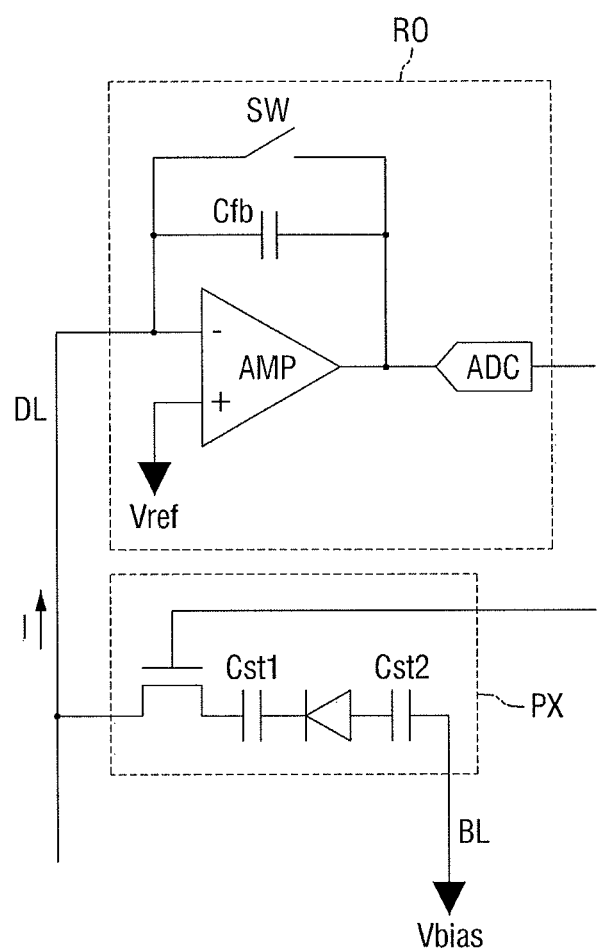
FIG. 8 is a circuit view of an X-ray detecting apparatus according to an exemplary embodiment.

FIG. 8 is a circuit view of an X-ray detecting apparatus according to another exemplary embodiment.

Referring to FIG. 8, the X-ray detecting apparatus according to the present embodiment is different from the X-ray detecting apparatuses shown in FIGS. 3 and 6 in that a first storage capacitor Cst1 and a second storage capacitor Cst2 are provided.

One end of the first storage capacitor Cst1 is connected to a cathode electrode of a photo diode PD and the other end of the first storage capacitor Cst1 is connected to a first electrode of a switching transistor T. One end of the second storage capacitor Cst2 is connected to a bias line BL and the other end of the second storage capacitor Cst2 is connected to an anode electrode of the photo diode PD.

Therefore, assuming that capacitance of the photo diode PD capacitor is denoted by $C_p$, capacitance of the first storage capacitor Cst1 is denoted by $C_{s1}$, and capacitance of the second storage capacitor Cst2 is denoted by $C_{s2}$, a total capacitance $C_{total}$ between the bias line BL supplying a bias voltage Vbias and the first electrode of the switching transistor T may be be calculated using the following equation.

$$1/C_{total} = 1/C_{s1} + 1/C_p + 1/C_{s2}$$

As understood from the above equation, the total capacitance C total is smaller than the photo diode capacitance $C_p$. Since the photo diode capacitance is proportional to the pixel RC delay, a reduction in the photo diode capacitance may reduce the pixel RC delay accordingly. Therefore, a pixel read-out time is shortened.

Figure 9:
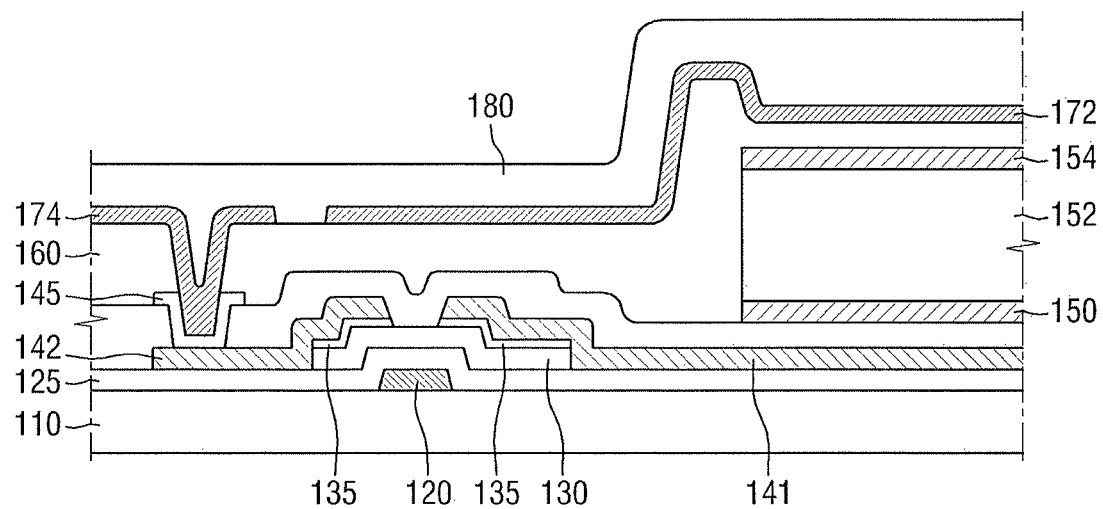
FIG. 9 is a cross-sectional view of the X-ray detecting apparatus shown in FIG. 8.

FIG. 9 is a cross-sectional view of the X-ray detecting apparatus shown in FIG. 8, illustrating an exemplary pixel of the X-ray detecting apparatus having a circuit configuration.

Referring to FIG. 9, in the X-ray detecting apparatus, a first interlayer dielectric film 145 is formed on a first electrode 141 and a cathode electrode 150 is formed thereon. The first electrode 141 and the cathode electrode 150 with the first interlayer dielectric film 145 interposed therebetween may constitute a first storage capacitor Cst1.

A second interlayer dielectric film 160 is formed on the anode electrode 154 and a bias line 172 is formed thereon. The bias line 172 does not make contact with the anode electrode 154. The bias line 172 and the anode electrode 154 with the second interlayer dielectric film 160 interposed therebetween may constitute a second storage capacitor Cst2. The second interlayer dielectric film 160 formed on the anode electrode 154 may include a recess region.

FIG. 9 illustrates a bottom-gate type thin film transistor is employed, but aspects are not limited thereto. For example, a top-gate type thin film transistor may also be used.

By way of summation and review, in early days, a film or computed radiography (CR) was used in an X-ray photographing system for photographing an image. In recent years, the X-ray photographing system has employed a digital radiography (DR) method for photographing an image because of the convenience in use.

The X-ray detection system based on the DR method, which includes a scintillator, indirectly measures the amount of detected X-rays by converting irradiated X-rays into visible light. According to the DR method, a photoelectric conversion element provided in each pixel has a predetermined capacitance. The larger the capacitance, the more the pixel RC delay, which may increase a data read-out time.

In contrast, embodiments relate to an apparatus for detecting an X-ray that may shorten a read-out time. According to an exemplary embodiment, since a capacitor is connected to a photo diode in series, a total capacitance may be reduced. Further, the pixel RC delay may be reduced, thereby shortening a data read-out time.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. An apparatus for detecting an X-ray, the apparatus comprising:
    a photo diode including an anode electrode and a cathode electrode;
    a switching transistor; and
    a first storage capacitor having a first end connected to the cathode electrode and a second end connected to the switching transistor, wherein a first electrode of the switching transistor constitutes the second end of the first storage capacitor.

2. The apparatus of claim 1, wherein the first storage capacitor is connected to the photo diode in series.

3. The apparatus of claim 2, wherein a bias voltage is applied to the anode electrode.

4. The apparatus of claim 1, further comprising
    a data line,
    wherein the switching transistor includes a gate electrode and a second electrode connected to the data line.

5. An apparatus for detecting an X-ray, comprising
    a photo diode including an anode electrode and a cathode electrode;
    a switching transistor;
    a first storage capacitor having a first end connected to the cathode electrode and a second end connected to the switching transistor; and
    a second storage capacitor having a first end connected to the anode electrode and a second end to which a bias voltage is applied.

6. An apparatus for detecting an X-ray, the apparatus comprising:
an X-ray receiving portion including a plurality of light sensing pixels; and
a data detector that detects an electrical signal transmitted from the X-ray receiving portion, wherein each of the plurality of light sensing pixels includes:
a photo diode including an anode electrode and a cathode electrode;
a switching transistor; and
a first storage capacitor having a first end connected to the cathode electrode and a second end connected to the switching transistor, wherein a first electrode of the switching transistor constitutes the second end of the first storage capacitor.

7. The apparatus of claim 6, wherein the first storage capacitor is connected to the photo diode in series.

8. The apparatus of claim 6, further comprising
a data line,
wherein the switching transistor includes a gate electrode and a second electrode, the second electrode being connected to the data line.

9. The apparatus of claim 8, wherein the data detector includes a read-out portion connected to the data line, the read-out portion including an amplifier, a feedback capacitor, and a reset switch.

10. The apparatus of claim 9, wherein the data line is connected to a first input port of the amplifier, a reference voltage is applied to a second input port of the amplifier, one end of the feedback capacitor is connected to an output port of the amplifier, and the reset switch is connected to the feedback capacitor in parallel.

11. An apparatus for detecting an X-ray, the apparatus comprising:
a photo diode including an anode electrode and a cathode electrode;
a switching transistor;
a bias line; and
a storage capacitor having a first end which constitutes a portion of the bias line and a second end connected to the anode electrode.

12. The apparatus of claim 11, wherein the storage capacitor is connected to the photo diode in series.

13. The apparatus of claim 11, further comprising
a data line,
wherein the switching transistor includes a gate electrode, a first electrode, and a second electrode, the first electrode being connected to the second end of the storage capacitor and the second electrode being connected to the data line.

14. An apparatus for detecting an X-ray, the apparatus comprising:
a thin film transistor that is on a substrate and that includes a gate electrode, a first electrode, and a second electrode;
a first interlayer dielectric film on the thin film transistor;
a cathode electrode that overlaps the first electrode with the first interlayer dielectric film interposed between the cathode electrode and the first electrode;
a photoconductor layer on the cathode electrode; and
an anode electrode on the photoconductor layer, wherein the first electrode and the cathode electrode constitute both ends of a storage capacitor.

15. The apparatus of claim 14, further comprising:
a second interlayer dielectric film on the anode electrode; and
a bias line that is on the second interlayer dielectric film and that is electrically connected to the anode electrode through a contact hole.

16. The apparatus of claim 14, further comprising:
a second interlayer dielectric film on the anode electrode; and
a bias line that overlaps the anode electrode with the second interlayer dielectric film interposed between the bias line and the anode electrode.

17. An apparatus for detecting an X-ray, the apparatus comprising:
a thin film transistor that is on a substrate and that includes a gate electrode, a first electrode, and a second electrode;
a first interlayer dielectric film on the thin film transistor;
a cathode electrode that is on the first electrode and that is electrically connected to the first electrode;
a photoconductor layer on the cathode electrode;
an anode electrode on the photoconductor layer;
a second interlayer dielectric film on the anode electrode; and
a bias line that overlaps the anode electrode with the second interlayer dielectric film interposed between the bias line and the anode electrode.

18. The apparatus of claim 17, wherein the first electrode and the cathode electrode constitute both ends of a storage capacitor.

19. An apparatus for detecting an X-ray, the apparatus comprising:
a photo diode including a first electrode and a second electrode;
a switching transistor; and
a storage capacitor having a first end connected to the first electrode of the photo diode and a second end connected to the switching transistor, wherein a first electrode of the switching transistor constitutes the second end of the storage capacitor.

\* \* \* \* \*